(12) United States Patent
Yoon et al.

(10) Patent No.: US 8,182,633 B2
(45) Date of Patent: May 22, 2012

(54) METHOD OF FABRICATING A FLEXIBLE DISPLAY DEVICE

(75) Inventors: Min-Ho Yoon, Suwon-si (KR); Nam-Seok Roh, Seongnam-si (KR); Myung-Hwan Kim, Yongin-si (KR); Sang-Il Kim, Yongin-si (KR); Woo-Jae Lee, Yongin-si (KR); Jong-Seong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 170 days.

(21) Appl. No.: 12/772,906

(22) Filed: May 3, 2010

(65) Prior Publication Data

US 2010/0210055 A1    Aug. 19, 2010

Related U.S. Application Data

(63) Continuation-in-part of application No. 12/207,327, filed on Sep. 9, 2008, now Pat. No. 8,034,206.

(30) Foreign Application Priority Data

Apr. 29, 2008 (KR) .................. 10-2008-0040006

(51) Int. Cl.
*B29C 65/48* (2006.01)
*B32B 37/26* (2006.01)
*B32B 38/10* (2006.01)
*B32B 43/00* (2006.01)

(52) U.S. Cl. .............. 156/247; 156/272.8; 156/289
(58) Field of Classification Search ................ 156/230, 156/235, 239, 241, 247, 272.2, 272.8, 273.5, 156/289, 308.2; 430/11, 14, 18, 201, 256, 430/259; 438/48–98, 128, 381, 455
See application file for complete search history.

(56) References Cited

U.S. PATENT DOCUMENTS

| | | | | |
|---|---|---|---|---|
| 6,127,199 A * | 10/2000 | Inoue et al. | ..................... | 438/30 |
| 6,350,386 B1 * | 2/2002 | Lin | ................................ | 216/13 |
| 6,372,608 B1 * | 4/2002 | Shimoda et al. | .............. | 438/455 |
| 6,404,555 B1 * | 6/2002 | Nishikawa | ..................... | 359/619 |
| 6,521,511 B1 | 2/2003 | Inoue et al. | | |
| 6,613,610 B2 * | 9/2003 | Iwafuchi et al. | .............. | 438/128 |
| 6,645,830 B2 * | 11/2003 | Shimoda et al. | .............. | 438/455 |
| 6,683,416 B1 * | 1/2004 | Oohata et al. | .............. | 315/169.3 |
| 6,700,631 B1 * | 3/2004 | Inoue et al. | ..................... | 349/45 |
| 6,818,530 B2 * | 11/2004 | Shimoda et al. | .............. | 438/455 |
| 6,870,190 B2 * | 3/2005 | Okuyama et al. | ............... | 257/79 |
| 6,872,635 B2 * | 3/2005 | Hayashi et al. | .............. | 438/463 |
| 6,873,092 B2 * | 3/2005 | Tomoda et al. | .............. | 313/112 |

(Continued)

FOREIGN PATENT DOCUMENTS

JP       2004-111905 A    4/2004

(Continued)

*Primary Examiner* — Philip Tucker
*Assistant Examiner* — Sing P Chan
(74) *Attorney, Agent, or Firm* — Innovation Counsel LLP

(57) ABSTRACT

A method of fabricating a flexible display device. The method includes forming an adhesive layer on a first carrier substrate; laminating a first flexible substrate on the adhesive layer, so that a first separation layer of the first flexible substrate is disposed on the adhesive layer; forming a thin film transistor array on the first flexible substrate; and separating the first carrier substrate from the flexible substrate by directing a laser beam onto the first separation layer. The first separation layer comprises silicon nitride (SiNx) with amounts of nitride A1 and amounts of silicon B1 satisfying $0.18 \leq \{A1/B1\} \leq 0.90$.

20 Claims, 18 Drawing Sheets

U.S. PATENT DOCUMENTS

| | | | | |
|---|---|---|---|---|
| 6,878,607 B2* | 4/2005 | Inoue et al. | | 438/458 |
| 6,885,389 B2* | 4/2005 | Inoue et al. | | 346/45 |
| 7,074,644 B2* | 7/2006 | Kimura | | 438/106 |
| 7,094,665 B2* | 8/2006 | Shimoda et al. | | 438/455 |
| 7,217,334 B2* | 5/2007 | Toyoda | | 156/230 |
| 7,319,471 B2* | 1/2008 | Natori et al. | | 345/690 |
| RE40,601 E* | 12/2008 | Inoue et al. | | 257/59 |
| 7,468,308 B2* | 12/2008 | Shimoda et al. | | 438/455 |
| 7,534,544 B2* | 5/2009 | Principe et al. | | 430/200 |
| 7,744,717 B2* | 6/2010 | Andrews et al. | | 156/247 |
| 7,745,252 B2* | 6/2010 | Suzuki et al. | | 438/82 |
| 7,829,432 B2* | 11/2010 | Ohnuma et al. | | 438/457 |
| 8,048,728 B2* | 11/2011 | Yamazaki | | 438/164 |
| 2002/0070454 A1* | 6/2002 | Yasukawa | | 257/760 |
| 2002/0146893 A1* | 10/2002 | Shimoda et al. | | 438/458 |
| 2003/0040164 A1* | 2/2003 | Inoue et al. | | 438/438 |
| 2003/0104309 A1* | 6/2003 | Koops et al. | | 430/201 |
| 2003/0201508 A1* | 10/2003 | Yasukawa | | 257/435 |
| 2003/0207545 A1* | 11/2003 | Yasukawa | | 438/459 |
| 2003/0224582 A1* | 12/2003 | Shimoda et al. | | 438/458 |
| 2004/0001972 A1* | 1/2004 | Chin et al. | | 428/690 |
| 2004/0191564 A1* | 9/2004 | Kim et al. | | 428/690 |
| 2004/0219762 A1* | 11/2004 | Shimoda et al. | | 438/455 |
| 2005/0087289 A1* | 4/2005 | Toyoda | | 156/230 |
| 2005/0095459 A1* | 5/2005 | Chin et al. | | 428/690 |
| 2005/0106839 A1* | 5/2005 | Shimoda et al. | | 438/458 |
| 2005/0112303 A1* | 5/2005 | Kim et al. | | 428/32.81 |
| 2005/0118525 A1* | 6/2005 | Kim et al. | | 430/200 |
| 2005/0136344 A1* | 6/2005 | Kang et al. | | 430/18 |
| 2005/0142380 A1* | 6/2005 | Chin et al. | | 428/690 |
| 2006/0030122 A1* | 2/2006 | Shimoda et al. | | 438/455 |
| 2006/0084006 A1* | 4/2006 | Kang et al. | | 430/199 |
| 2006/0159867 A1* | 7/2006 | O'Donnell | | 428/1.5 |
| 2006/0279679 A1* | 12/2006 | Fujisawa et al. | | 349/116 |
| 2007/0010067 A1* | 1/2007 | Shimoda et al. | | 438/455 |
| 2007/0048970 A1* | 3/2007 | Suzuki et al. | | 438/455 |
| 2007/0126966 A1* | 6/2007 | Takahashi | | 349/130 |
| 2008/0043045 A1* | 2/2008 | Natori et al. | | 345/690 |
| 2008/0261379 A1* | 10/2008 | Jinbo et al. | | 438/458 |
| 2008/0286681 A1* | 11/2008 | Potts et al. | | 430/200 |
| 2009/0047859 A1* | 2/2009 | Kim et al. | | 445/24 |
| 2009/0104570 A1* | 4/2009 | Caron | | 430/323 |
| 2009/0105071 A1* | 4/2009 | Principe et al. | | 503/227 |
| 2009/0266471 A1* | 10/2009 | Kim et al. | | 156/67 |
| 2009/0297739 A1* | 12/2009 | Baily et al. | | 428/32.74 |
| 2010/0239794 A1* | 9/2010 | Andrews et al. | | 428/32.72 |
| 2011/0039395 A1* | 2/2011 | Ohnuma et al. | | 438/458 |

FOREIGN PATENT DOCUMENTS

| | | |
|---|---|---|
| JP | 2005-136214 A | 5/2005 |
| JP | 2006-338035 A | 12/2006 |
| KR | 1020030009824 A | 2/2003 |
| KR | 1020050116844 A | 12/2005 |
| KR | 1020060061305 A | 6/2006 |

* cited by examiner

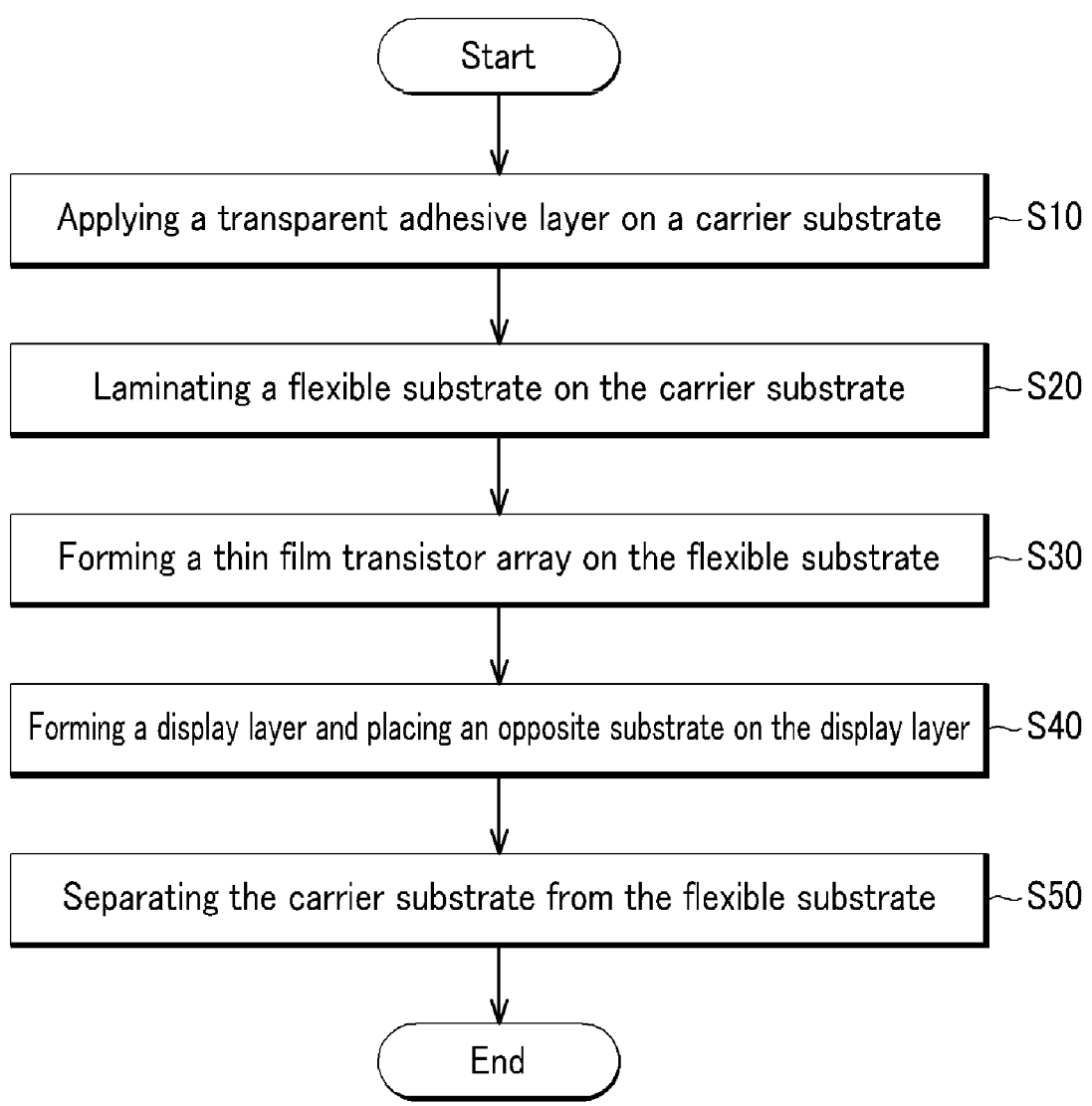

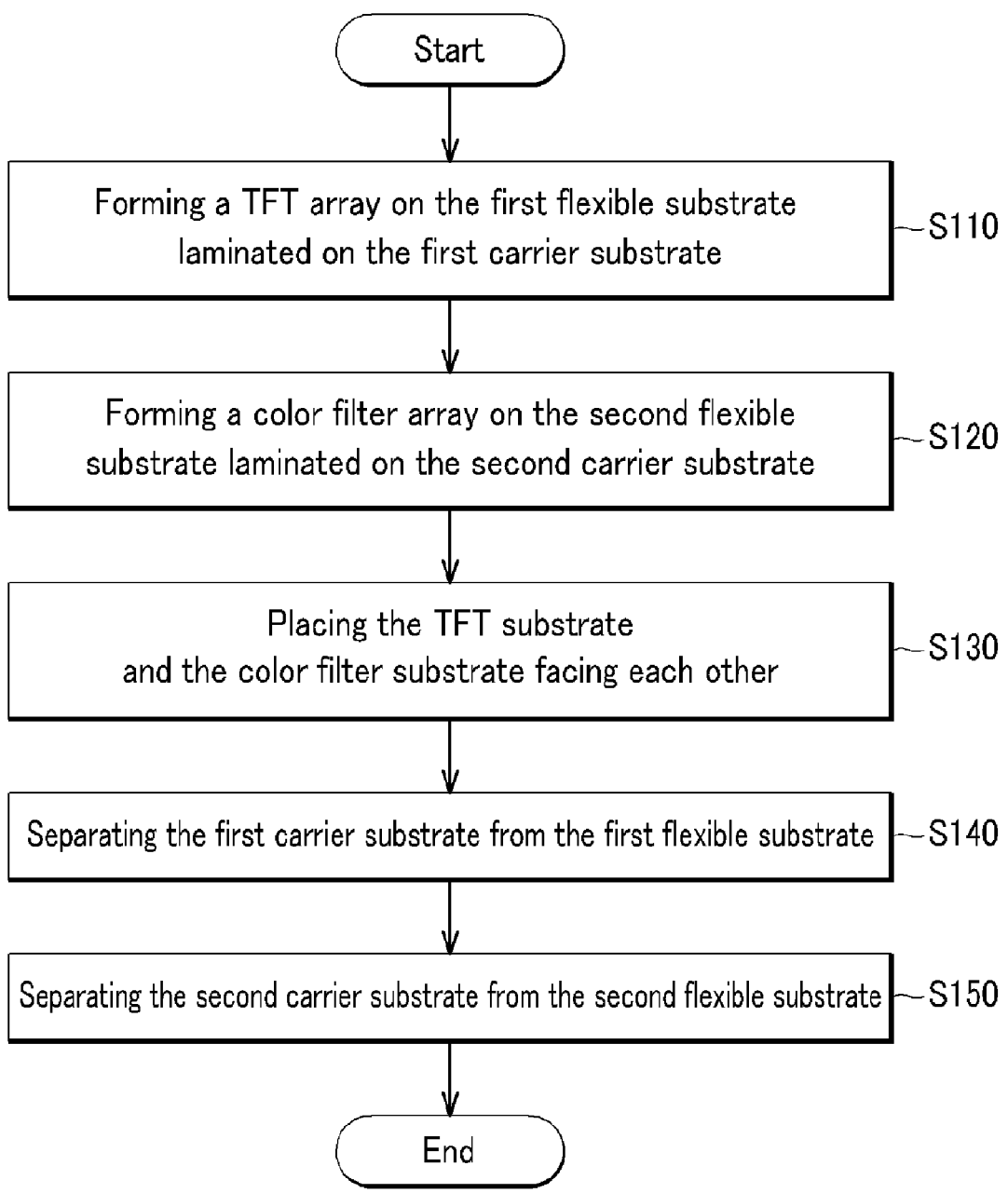

Laser Beam

METHOD OF FABRICATING A FLEXIBLE DISPLAY DEVICE

CROSS-REFERENCE TO RELATED APPLICATIONS

This application is a continuation-in-part application of U.S. application Ser. No. 12/207,327 filed on Sep. 9, 2008, now U.S. Pat. No. 8,034,206, which claims priority to Korean Patent Application No. 10-2008-0040006, filed on Apr. 29, 2008, with all the benefits accruing therefrom under 35 U.S.C. §119. The entire contents of each of these applications are hereby incorporated by reference.

BACKGROUND OF THE INVENTION (a) Field of the Invention

The disclosure relates to display devices, and more particularly, to a method of fabricating a flexible display device.

(b) Description of the Related Art

Contemporary flat panel display devices are often capable of achieving a large display area, while also being relatively lightweight and having a slim, or thin, profile. Flat panel display devices include liquid crystal displays ("LCDs"), plasma display panels ("PDPs"), organic light emitting displays ("OLEDs"), and the like. Conventional LCDs, PDPs, and OLEDs often use a glass substrate that can be overly brittle and prone to cracking.

Recently, flexible display devices using a flexible substrate, such as plastic or foil, instead of a glass substrate have actively been developed. The process of fabricating a display panel with these flexible substrates typically involves fabricating a thin film transistor ("TFT") layer on a plastic substrate ("TOP"). However, fabricating a display panel by directly forming a TFT on the plastic substrate instead of the glass substrate still presents difficulties in due to the flexibility of the plastic substrate.

Accordingly, current fabrication processes often apply a rigid carrier substrate to the flexible plastic substrate, usually via an additional adhesive layer and separation layer. The TFT array is then directly fabricated on the plastic substrate, which has been effectively stiffened by the added carrier substrate. Once the TFT array is fabricated, the carrier substrate is detached from the plastic substrate.

However, an additional process is needed for forming the separation layer on the carrier substrate, thereby adding process time and expense.

SUMMARY OF THE INVENTION

An aspect of the invention provides a fabricating method of a flexible display device that can separate a carrier substrate from a plastic substrate without a process for forming a separation layer between the plastic substrate and the carrier substrate. This is accomplished by using a barrier layer previously formed on the plastic substrate instead of the separation layer.

An aspect of the present invention provides a fabricating method of a flexible display device that can effectively separate a carrier substrate from a plastic substrate, and does not lose a barrier layer of the plastic substrate after separating.

A fabricating method of a flexible display device according to an exemplary embodiment of the present invention includes: forming an adhesive layer on a first carrier substrate; laminating a first flexible substrate on the adhesive layer, so that a first separation layer of the first flexible substrate is disposed on the adhesive layer; forming a thin film transistor array on the first flexible substrate; and separating the first carrier substrate from the flexible substrate by directing a laser beam onto the first separation layer.

The first separation layer comprises silicon nitride (SiNx), wherein the silicon nitride comprises an amount of nitride A1 and an amount of silicon B1, the amount of nitride A1 and the amount of silicon B1 satisfying $0.18 \leqq \{A1/B1\} \leqq 0.90$.

The first flexible substrate may further comprise a first barrier layer, where the first barrier layer contacts the first separation layer.

The first barrier layer may comprise silicon nitride, the silicon nitride further comprising an amount of nitride A2 and an amount of silicon B2, and of the amount of nitride A2 and the amount of silicon B2 satisfy the condition $(A2/B2) > (A1/B1)$.

The amount of nitride A1 and the amount of silicon B1 may further satisfy the condition $0.18 \leqq \{A1/B1\} \leqq 0.70$.

After the separating, contact can be maintained between the first barrier layer and a remainder of the first flexible substrate.

The first separation layer may be formed in the presence of a reaction gas, the reaction gas comprising argon and nitride in a ratio in the range of 7:1 to 20:1.

The method may further comprise, after the forming a thin film transistor array, forming a display layer on the first flexible substrate, and forming an opposite substrate on the display layer.

The display layer may comprise at least one of a liquid crystal layer, an electrophoretic film, and a light emitting layer.

The separating the first carrier substrate can further comprise directing a laser beam through the first carrier substrate so as to focus the laser beam on the first separation layer.

The directing can further comprise focusing the laser beam on the first separation layer so as to at least partially alter a composition of the first separation layer.

The transparent adhesive layer may include a polymer adhesive including a series of at least one of silicon and an acryl.

The transparent adhesive layer may include polydimethylsiloxane.

The laser beam may include an excimer laser beam having a wavelength of approximately 265 nm to approximately 308 nm.

A fabricating method of a flexible display device according to another exemplary embodiment of the present invention includes: forming a first adhesive layer on a first carrier substrate; laminating a first flexible substrate on the first adhesive layer so that a first separation layer of the first flexible substrate is disposed on the first adhesive layer; forming a thin film transistor array on the first flexible substrate; forming a second adhesive layer on a second carrier substrate; laminating a second flexible substrate on the second adhesive layer, so that a second separation layer of the second flexible substrate is disposed on the second adhesive layer; forming a color filter array on the second flexible substrate; coupling the first flexible substrate to the second flexible substrate; separating the first carrier substrate from the first flexible substrate by directing a first laser beam onto the first separation layer; and separating the second carrier substrate from the second flexible substrate by directing a second laser beam onto the second separation layer.

The first separation layer comprises silicon nitride (SiNx), wherein the silicon nitride comprises an amount of nitride A1 and an amount of silicon B1, the amount of nitride A1 and the amount of silicon B1 satisfying $0.18 \leqq \{A1/B1\} \leqq 0.90$.

The first and second flexible substrates may respectively further comprise first and second barrier layers, where the first barrier layer contacts the first separation layer, and the second barrier layer contacts the second separation layer.

The first barrier layer and the second barrier layer may each comprise silicon nitride.

The method may further comprise forming a display layer between the first flexible substrate and the second flexible substrate.

The display layer may comprise at least one of a liquid crystal layer, an electrophoretic film, or a light emitting layer.

The directing a first laser beam may further comprise directing the first laser beam through the first transparent adhesive layer so as to focus the first laser beam on a surface of the first separation layer, and the directing a second laser beam may further comprise directing the second laser beam through the second adhesive layer so as to focus the second laser beam on the surface of the second separation layer.

The first and the second laser beams may each comprise an excimer laser with a wavelength of approximately 265 nm to approximately 308 nm.

As described above, in a fabricating method of a flexible display device according to the present invention, the carrier substrate and the flexible (e.g., plastic) substrate are coupled together with a transparent adhesive, and the flexible substrate includes a separation layer that comprises SiNx having a predetermined composition ratio. The composition of the separation layer allows for relatively easy separation of the flexible substrate from the carrier substrate by irradiating a laser beam on the separation layer. Additionally, what remains of the separation layer may act to further protect the flexible substrate.

BRIEF DESCRIPTION OF THE DRAWINGS

The above and other features and advantages of the invention will be more clearly understood from the following detailed description taken in conjunction with the accompanying drawings, in which:

FIG. 1 is a flow chart showing a process of fabricating a flexible display device in accordance with an embodiment of the present invention;

FIG. 3 is a flow chart showing a process of fabricating a flexible display device in accordance with another embodiment of the present invention.

Like reference numerals refer to corresponding parts throughout the drawings.

DETAILED DESCRIPTION OF THE EMBODIMENTS

Hereinafter, exemplary embodiments are described in detail with reference to FIGS. 1 to 4F.

FIG. 1 is a flow chart showing a process of fabricating a flexible display device in accordance with an embodiment of the present invention. FIGS. 2A-2F are cross-sectional views further illustrating the process of FIG. 1.

Referring to FIG. 1, a fabricating method of a flexible display device includes applying a transparent adhesive layer on a carrier substrate (step S10), laminating a flexible substrate on the carrier substrate (step S20), forming a thin film transistor ("TFT") array on the flexible substrate (step S30), forming a display layer and placing an opposite substrate on the display layer (step S40), and separating the carrier substrate from the flexible substrate (step S50). This method is described below in further detail with reference to FIGS. 2A to 2F.

Figure 2A:
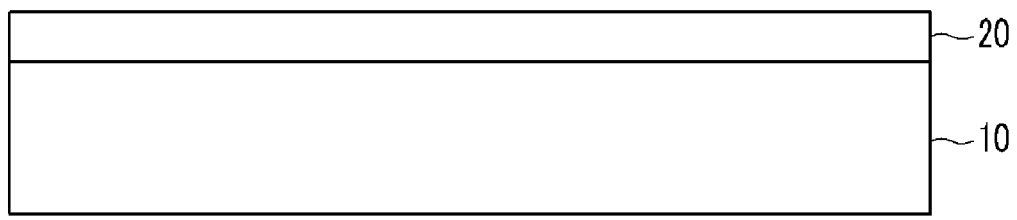
FIGS. 2A-2F are cross-sectional views showing a process of fabricating a flexible display device in accordance with an embodiment of the present invention.

Referring to FIG. 1, a fabricating method of a flexible display device includes applying a transparent adhesive layer on a carrier substrate (step S10), laminating a flexible substrate on the carrier substrate (step S20), forming a thin film transistor ("TFT") array on the flexible substrate (step S30), forming a display layer and placing an opposite substrate on the display layer (step S40), and separating the carrier substrate from the flexible substrate (step S50). This method is described below in further detail with reference to FIGS. 2A to 2F. Referring to FIG. 2A, a transparent adhesive layer 20, i.e. a layer that is substantially transparent to a laser beam of a desired wavelength, is formed on a carrier substrate 10. The carrier substrate 10 may be formed of an insulating material such as glass. The transparent adhesive layer 20 may have a transmittance at a specified wavelength, passing through a laser beam of that wavelength, and may have a glass transition temperature greater than 220.degree.C.

The transparent adhesive layer 20 may comprise a polymer adhesive including a series of silicone or acryl. More specifically, the transparent adhesive layer 20 may comprise polysilicone including polydimethylsiloxane ("PDMS") or a mixture of PDMS and silica nanopowder. For example, 290ULTRACLEAN™, a product provided by 3M™, can be used as polysilicone for an adhesive layer. The adhesive layer 20 may be applied to the carrier substrate 10 by a printing method, a slit coating method, a spin coating method, a dipping method, or the like.

Figure 2B:
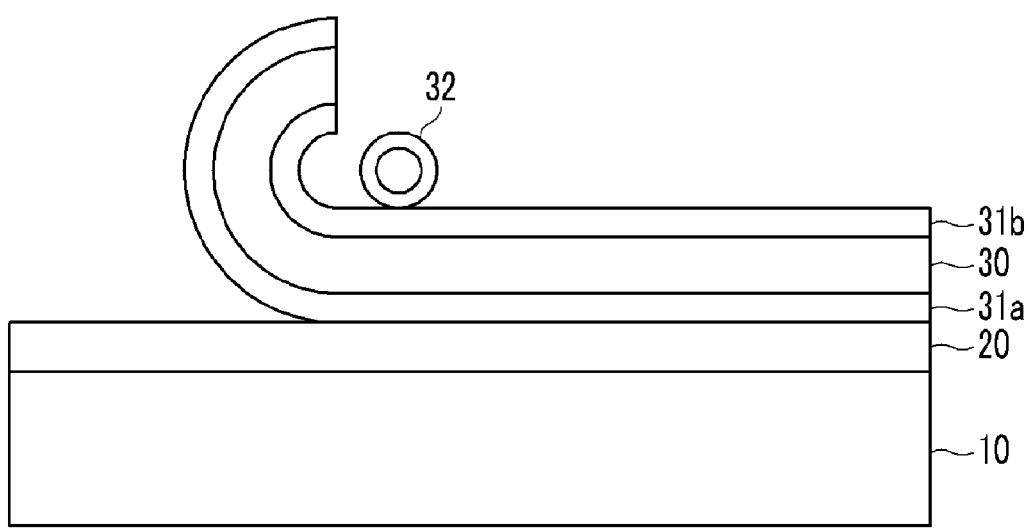

Referring to FIG. 2B, a flexible substrate 30, including first and second barrier layers 31a and 31b, is applied to the transparent adhesive layer 20. The flexible substrate 30 may be applied by a lamination method, e.g., by using a roller 32. The flexible substrate 30 is formed of a polymer material preferably including at least one of Kapton™, polyether sulphone ("PES"), polyethylene naphthalate ("PEN"), polycarbonate ("PC"), polyimide ("PI"), polyethylene terephthalate ("PET"), fiber reinforced plastic ("FRP"), or polyacrylate ("PAR").

The first and second barrier layers 31a and 31b are formed on the upper and lower faces of the flexible substrate 30, respectively, in order to prevent gas or moisture from infiltrating and diffusing into the flexible substrate 30. Alternatively, only one of the first and second barrier layers 31a and 31b may be formed on one of the upper or lower surfaces of the flexible substrate 30—namely, the surface that is irradiated by a laser beam. For example in one embodiment of the invention, if the lower surface of substrate 30 is to be irradiated by laser beam, then only one a barrier layer 31a may be formed on the lower surface of the flexible substrate 30.

The first and second barrier layers 31a and 31b may be formed by depositing hydrogenated silicon nitride ("SiNx: H") or hydrogenated amorphous silicon ("a-Si:H") on the flexible substrate 30. Also, the first and second barrier layers 31a and 31b may be formed on the flexible substrate 30 by coating photolysis high molecule material including organic photo resist, urethane based resin, epoxy based resin or acryl based resin.

Figure 2C:
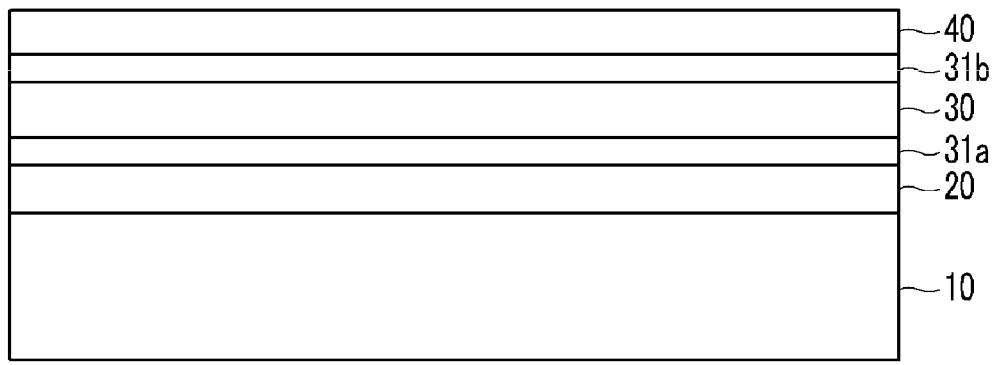

Referring to FIG. 2C, a TFT array 40 is formed on the flexible substrate 30, such as by well-known processes. The TFT array includes gate lines (not shown), data lines (not shown), TFTs (not shown) connected the gate lines and the data lines, and first electrodes (not shown) connected to the TFTs.

Each TFT supplies a data voltage (supplied from the data line) to a first electrode in response to a scan signal (supplied from the gate line). Each TFT typically includes a gate electrode (not shown), a source electrode (not shown), a drain electrode (not shown), an active layer (not shown), and an ohmic contacting layer (not shown).

Figure 2D:
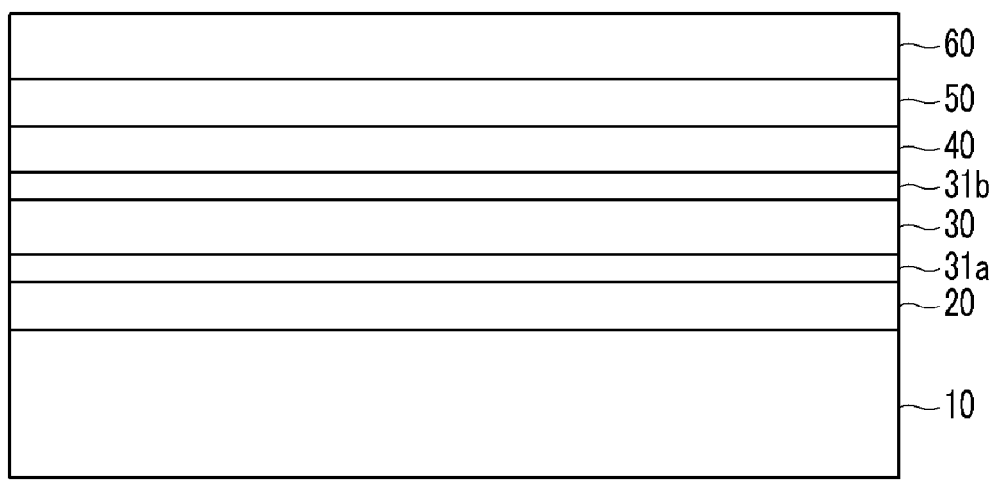

Referring to FIG. 2D, the display layer 50 and the opposite layer 60 are placed on the flexible substrate 30.

The display layer 50 may include at least one of a liquid crystal layer, an electrophoretic film, or a light emitting layer.

The opposite substrate 60 includes second electrodes, and is typically formed of a transparent material such as plastic or glass.

The second electrode is formed on the opposite substrate 60 so as to face the first electrode. The second electrode is formed of a transparent material like the opposite substrate 60. For example, the second electrode may be formed of indium tin oxide ("ITO"), indium zinc oxide ("IZO") or carbon nanotube ("CNT"). The second electrode forms the electric field together with the first electrode to control the display layer 40.

The opposite substrate 60 may further include a barrier layer (not shown).

In operation, each TFT can be switched on and have a data voltage supplied to one of its terminals. The TFT then applies a corresponding voltage across both its first electrode and a second electrode formed in an opposite substrate 60, thus generating a potential difference between the first and second electrodes. A display layer (50, refer to FIG. 2D to FIG. 2F) between the flexible substrate 30 and the opposite substrate 60 is driven by this potential difference, so as to display an image.

Figure 2E:
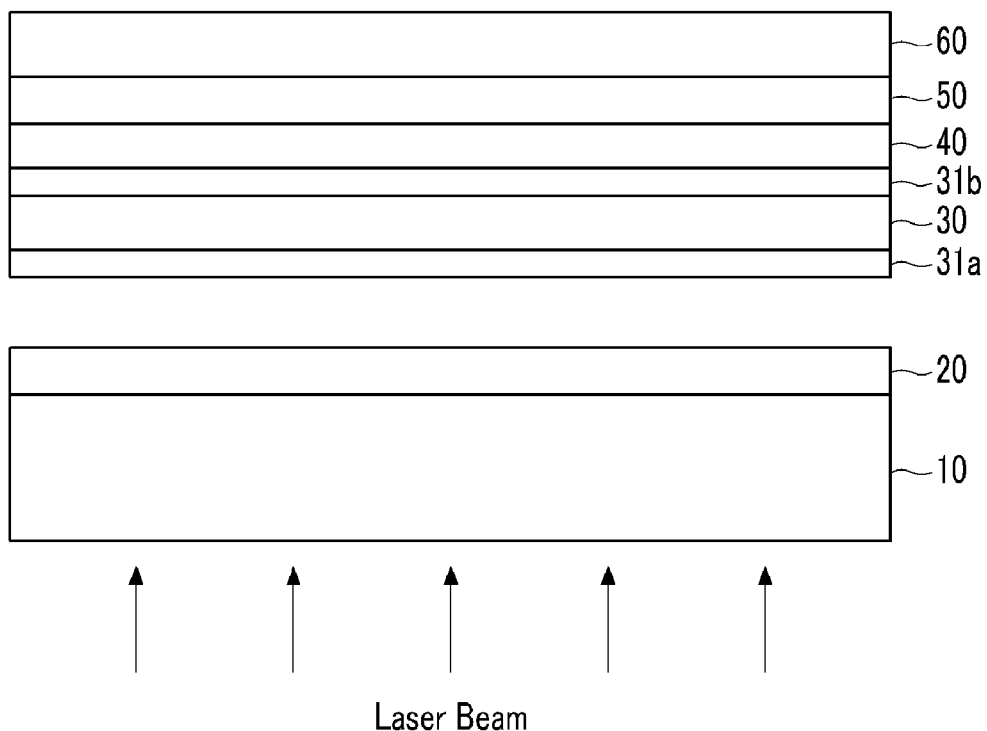
Figure 2F:
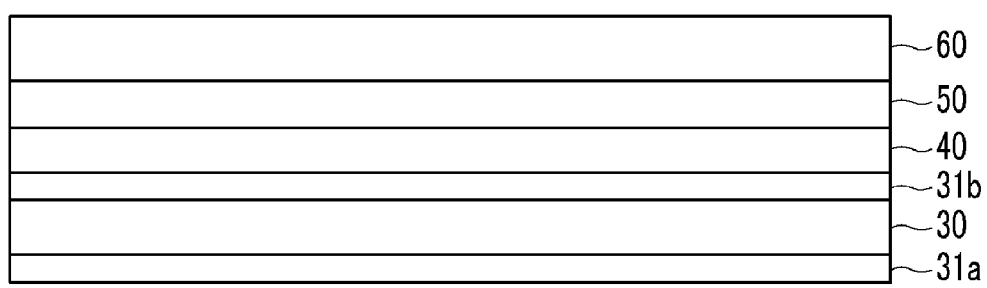

Referring to FIG. 2E and FIG. 2F, a flexible display device may be formed by irradiating a laser beam on a lower side of the carrier substrate 10. For example, the laser beam may be an excimer laser beam of approximately 265 nm to approximately 308 nm wavelength. When focused onto the barrier layer, the laser beam breaks a covalent bond of photolysis high molecule material in the barrier layer. The laser beam also releases a hydrogen molecule from SiNx:H or a-Si:H in the first barrier layer 31a. In this manner, the first barrier layer 31a is at least partially decomposed by the irradiation of the laser beam, allowing the carrier substrate 10 and the adhesive layer 20 to be separated from the flexible substrate 30. That is, the laser beam at least partially alters the composition of the layer upon which it is focused, reducing or eliminating its "adhesiveness" and allowing the substrate 10 and layer 20 to be more easily separated from flexible substrate 30. The laser beam may focus on a surface of the first barrier layer 31A by controlling the intensity of the laser beam and the depth of focus ("DOF") using optical instruments. Therefore, the laser beam need not pass through the flexible substrate 30 and the second barrier layer 31b. The second barrier layer 31b may thus be omitted.

FIG. 3 is a flow chart showing a process of fabricating a flexible display device in accordance with another embodiment of the present invention. FIGS. 4A-4F are cross-sectional views further illustrating the process of FIG. 3.

Referring to FIG. 3, a method of fabricating a flexible display device in accordance with another embodiment of the present invention includes laminating a first flexible substrate including a first barrier layer on a first carrier substrate, and forming a TFT array on the first flexible substrate (step S110). Next, a color filter substrate is formed on a second carrier substrate. The forming of this color filter substrate includes applying an adhesive layer on the second carrier substrate, laminating a second flexible substrate including a second barrier layer on the adhesive layer, and forming a color filter array on the second flexible substrate (step S120). Next, the TFT substrate and the color filter substrate are placed facing each other (step S130), the first carrier substrate is separated from the first flexible substrate (step S140), and the second carrier substrate is separated from the second flexible substrate (step S150).

Figure 4A:
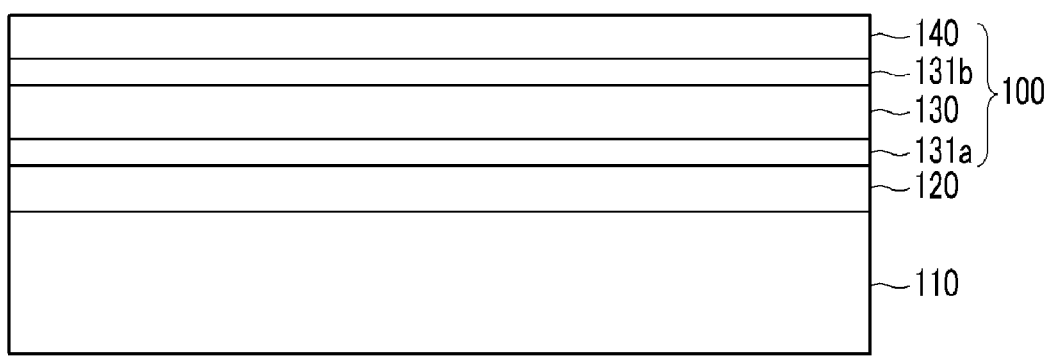
FIGS. 4A-4F are cross-sectional views showing a process of fabricating a flexible display device in accordance with another embodiment of the present invention.

Referring to FIG. 4A, a TFT substrate 100 is provided on a first carrier substrate 110, where this TFT substrate 100 includes a TFT array 140, a first flexible substrate 130, and barrier layers 131a and 131b. The TFT substrate 100 may be produced by applying a first transparent adhesive layer 120 on the first carrier substrate 110, laminating the first flexible substrate 130 including the barrier layer 131a and 131b on the transparent adhesive layer 120, and forming a TFT array 140 on the first flexible substrate 130. The above processes can be carried out in the same manner as the fabrication methods described above in connection with FIG. 2A to FIG. 2C. Therefore, redundant description of these processes is omitted.

Figure 4B:
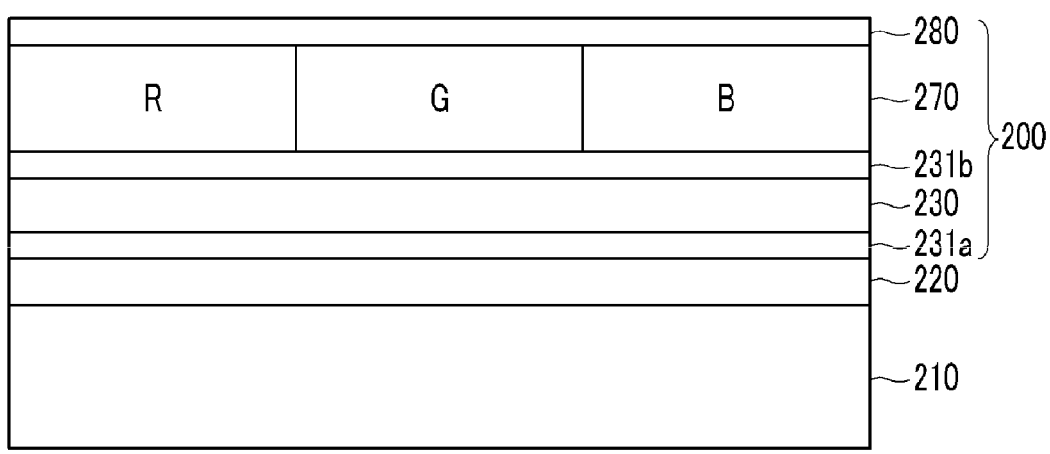

Referring to FIG. 4B, a color filter substrate 200 is provided on a second carrier substrate 210, where this substrate 200 includes a color filter array 270, a common electrode 280, a second flexible substrate 130 and barrier layers 231a and 231b. The color filter substrate 200 may be produced by applying a second transparent adhesive layer 220 on the second carrier substrate 210, laminating the second flexible substrate 230 (including barrier layers 231a and 231b) on the transparent adhesive layer 220, forming a color filter array 270 (including red ("R"), green ("G"), and blue ("B") color filters) on the first flexible substrate 130, and forming the common electrode 280 on the color filter array 270. The above processes can be the same as the fabricating method of FIG. 4A except that the color filter array 270 and the common electrode 280 are formed on the flexible substrate 230 instead of the TFT array. Therefore, any repetitive description is omitted.

Figure 4C:
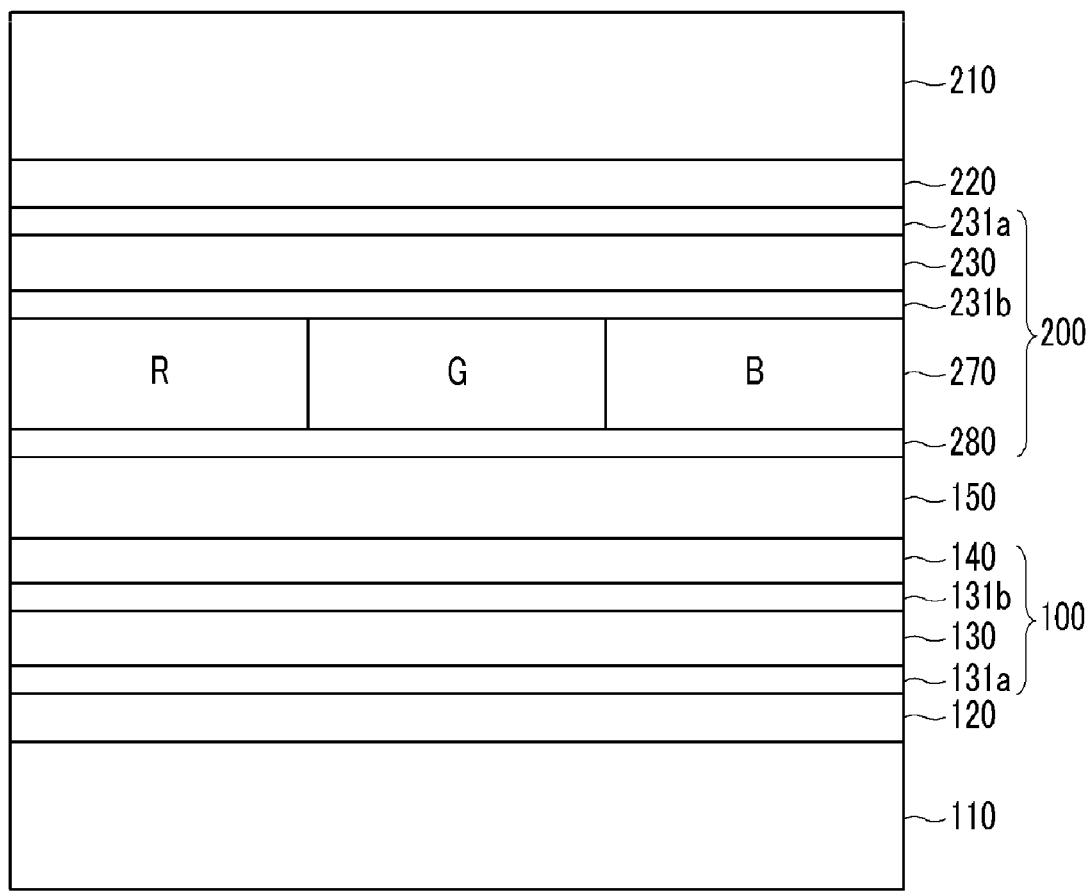

Referring to FIG. 4C, the color filter substrate 200 is placed facing the TFT substrate 100. A display layer 150 is formed between the TFT substrate 100 and the color filter array substrate 200. The display layer 150 may include at least one of a liquid crystal layer, an electrophoretic film, or a light emit layer.

Figure 4D:
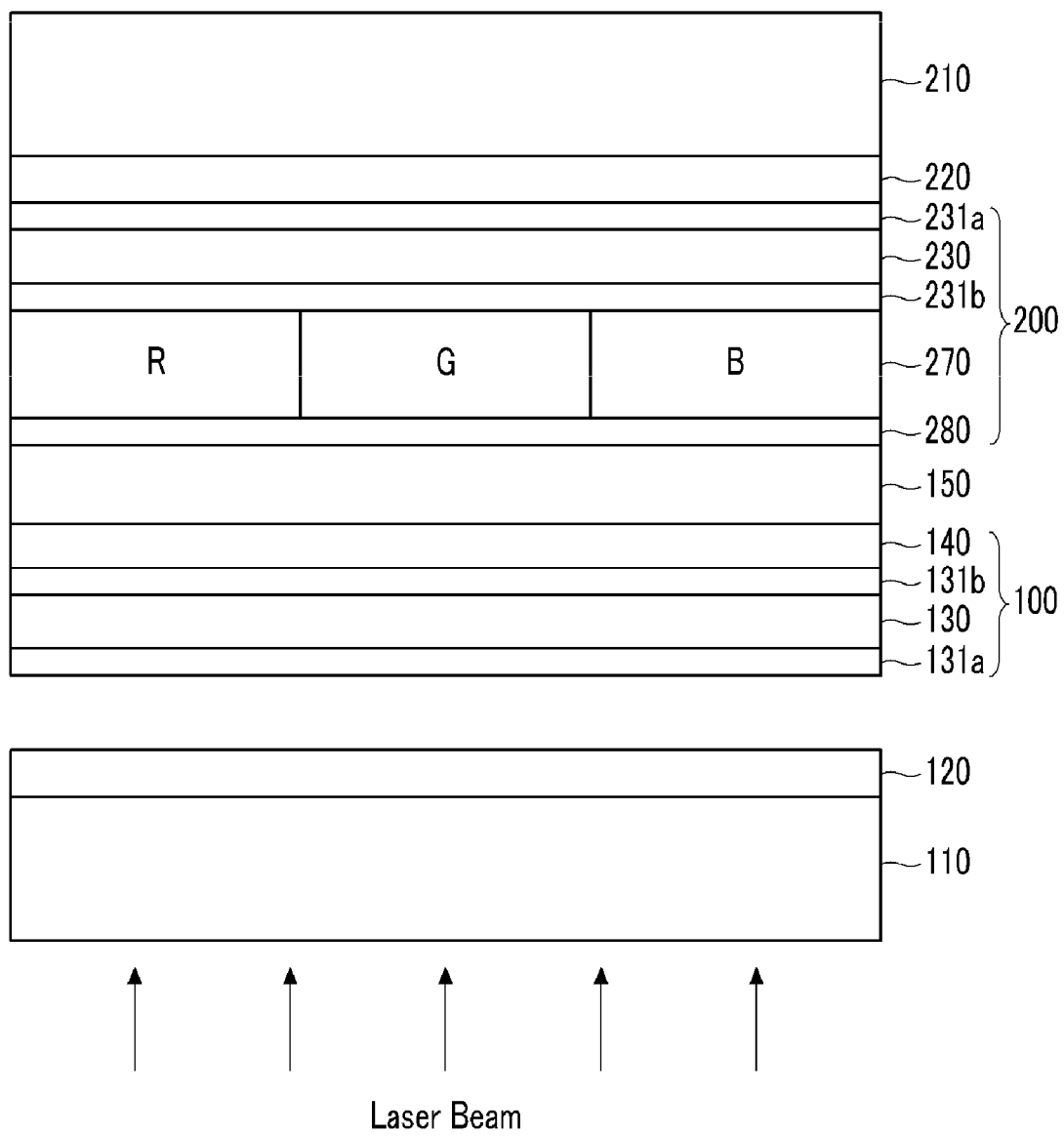

Referring to FIG. 4D, the first carrier substrate 110 and the first transparent adhesive layer 120 are separated from the TFT substrate 100 by focusing and irradiating a laser beam onto barrier layer 131a.

Figure 4E:
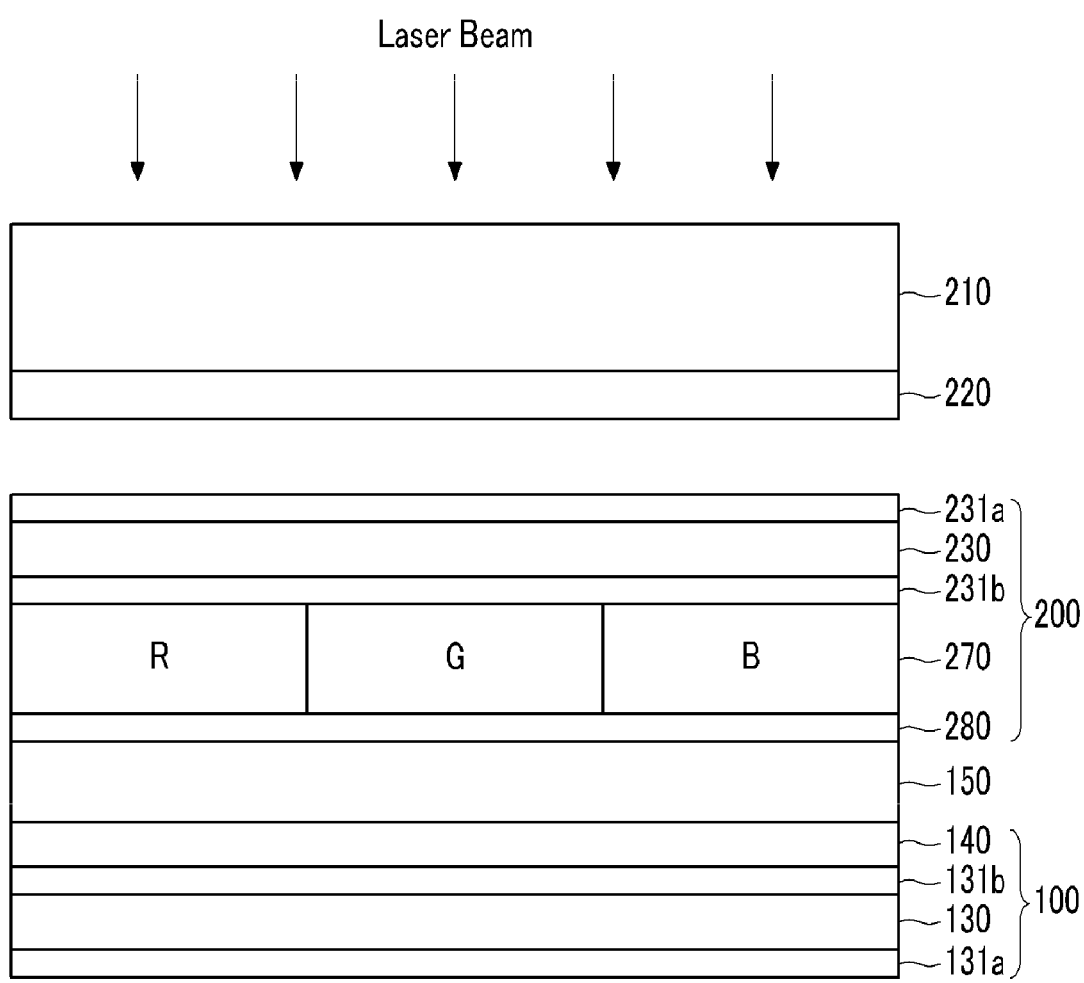
Figure 4F:
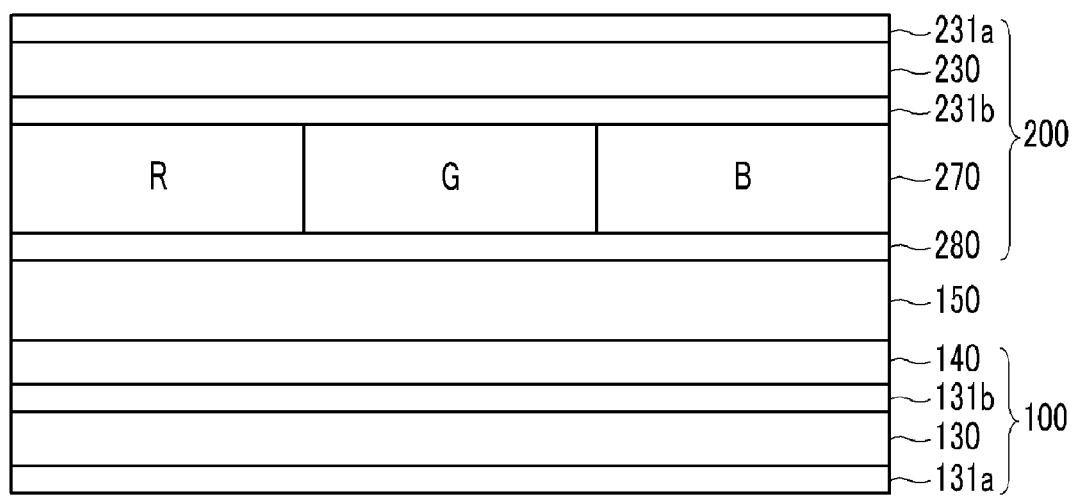

Referring to FIG. 4E and FIG. 4F, the second carrier substrate 210 and the second transparent adhesive layer 220 are separated from the color filter substrate 200 by focusing and irradiating a laser beam onto barrier layer 231a. In this manner, a flexible display device is formed in accordance with another embodiment of the present invention.

FIG. 5A to FIG. 5F are cross-sectional views showing a process of fabricating a flexible display device in accordance with another embodiment of the present invention.

Figure 5A:
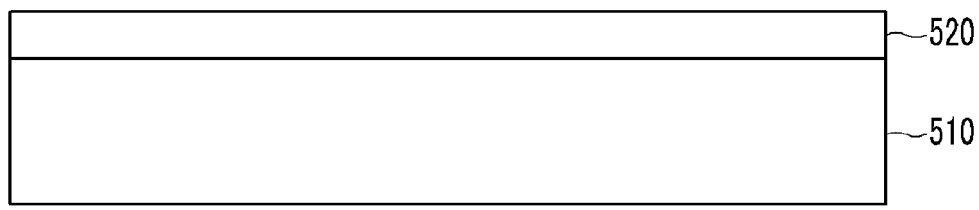
FIGS. 5A-5F are cross-sectional views showing a process of fabricating a flexible display device in accordance with another embodiment of the present invention.

Referring to FIG. 5A, a transparent adhesive layer 520 is formed on a carrier substrate 510. The carrier substrate 510 may be made of an insulating material such as glass. The transparent adhesive layer 520 may have sufficient transmittance to pass a laser beam of a specific wavelength therethrough, and may have a glass transition temperature of greater than 220° C. Thus, the transparent adhesive layer 520 may have a heat-resisting property.

For example, the adhesive layer 520 may include a polymer adhesive including a series of silicon or an acryl. Particularly, a polysilicon having a glass transition temperature of greater than 220° C. may be used. The transparent adhesive layer 520 may include a polysilicon including polydimethylsiloxane ("PDMS") or a mixture of PDMS and silica nanopowder. For example, 290ULTRACLEAN™, a product provided by 3M™, can be used as the polysilicon for an adhesive layer. The adhesive layer 520 may be formed by a printing method, a slit coating method, a spin coating method, a dipping method, or the like.

Figure 5B:
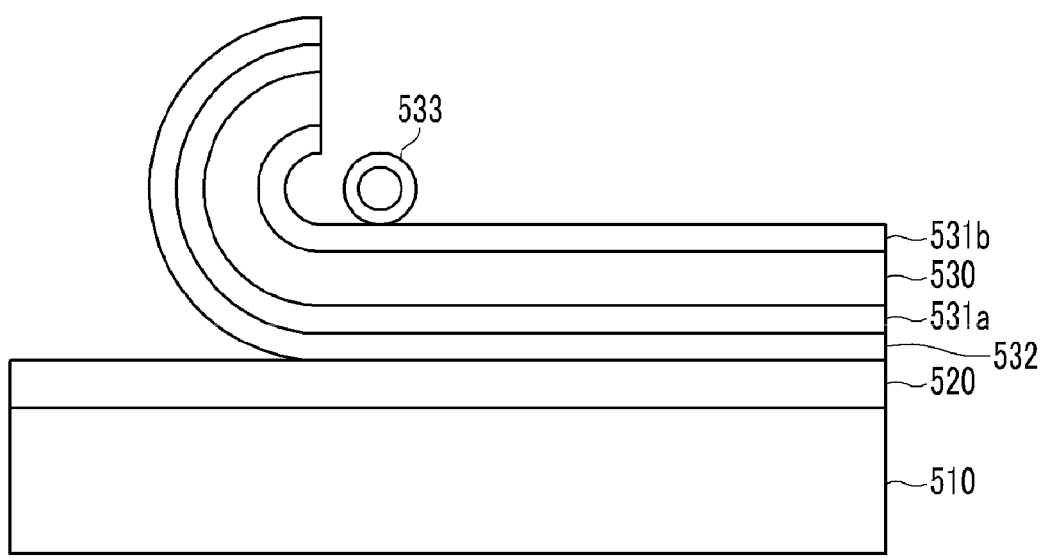

Referring to FIG. 5B, a flexible substrate 530 is formed on the transparent adhesive layer 520. The flexible substrate 530 may be applied by a lamination method using a roller 533. The flexible substrate 530 is formed of a polymer material preferably including at least one of Kapton™, polyether sulphone ("PES"), polyethylene naphthalate ("PEN"), polycarbonate ("PC"), a polyimide ("PI"), polyethylene terephthalate ("PET"), fiber reinforced plastic ("FRP"), or polyacrylate ("PAR").

The first and second barrier layers 531a and 531b are formed on the upper and lower faces of the flexible substrate 530. The barrier layers 531a and 531b help prevent gas or moisture from infiltrating or diffusing into the flexible substrate 30. Alternate embodiments may employ only one of the first and second barrier layers 531a and 531b, formed on only one of the upper or lower surfaces of the flexible substrate 530.

A separation layer 532 is formed on the first barrier layer 531a. The first barrier layer 531a and the separation layer 532 may be sequentially deposited on the flexible substrate 530 in known manner, through processes such as a sputtering or a chemical vapor deposition method.

The first and second barrier layers 531a and 531b may be formed of a silicon-based compound with good barrier characteristics, and the separation layer 532 may be made of a silicon-based compound with good separation characteristics when subjected to laser irradiation. For example, the separation layer 532 and the first and second barrier layers 531a and 531b may each be made of silicon nitride (SiNx).

Figure 5C:
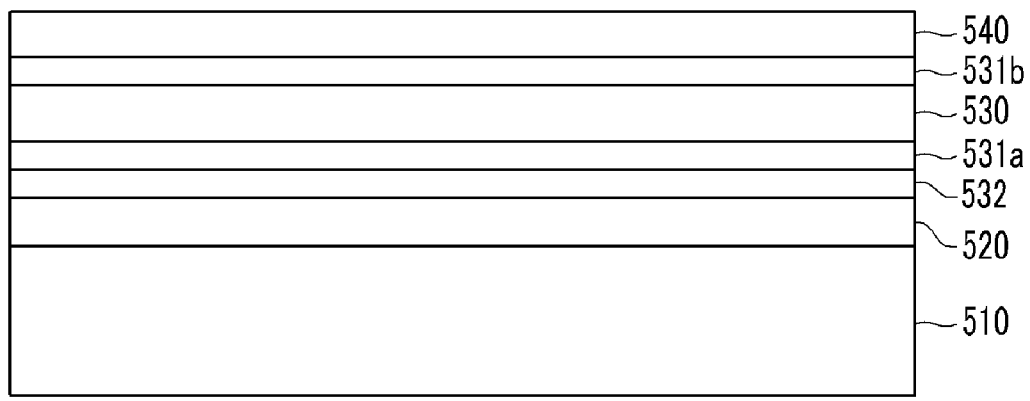

Referring to FIG. 5C, a TFT array 540 is formed on the flexible substrate 530. As is known, the TFT array 540 typically includes gate lines (not shown), data lines (not shown), TFTs (not shown) connected the gate lines and the data lines, and first electrodes (not shown) connected to the TFTs.

Figure 5D:
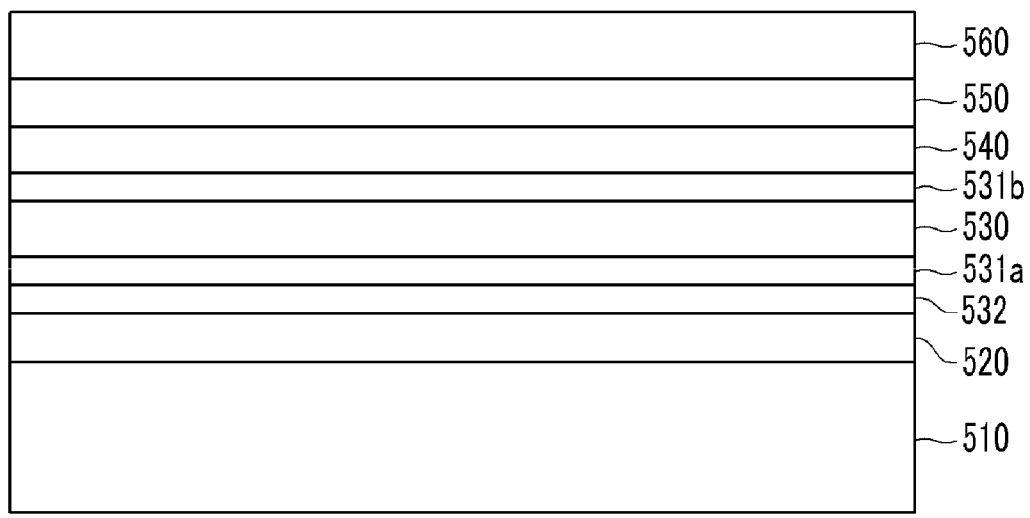

Referring to FIG. 5D, a display layer 550 and an opposite substrate 560 are formed on the TFT array 540. The display layer 550 may include at least one of a liquid crystal layer, an electrophoretic film, and a light emitting layer. The opposite substrate 560 can include second electrodes (not shown), and is formed of a transparent material. For example, the opposite substrate may be formed as a film using a plastic or glass material.

The second electrode is formed on the opposite substrate 560 to face the first electrode. The second electrode is formed of a transparent material for the incident light to be transmitted therethrough, like the opposite substrate 560.

Figure 5E:
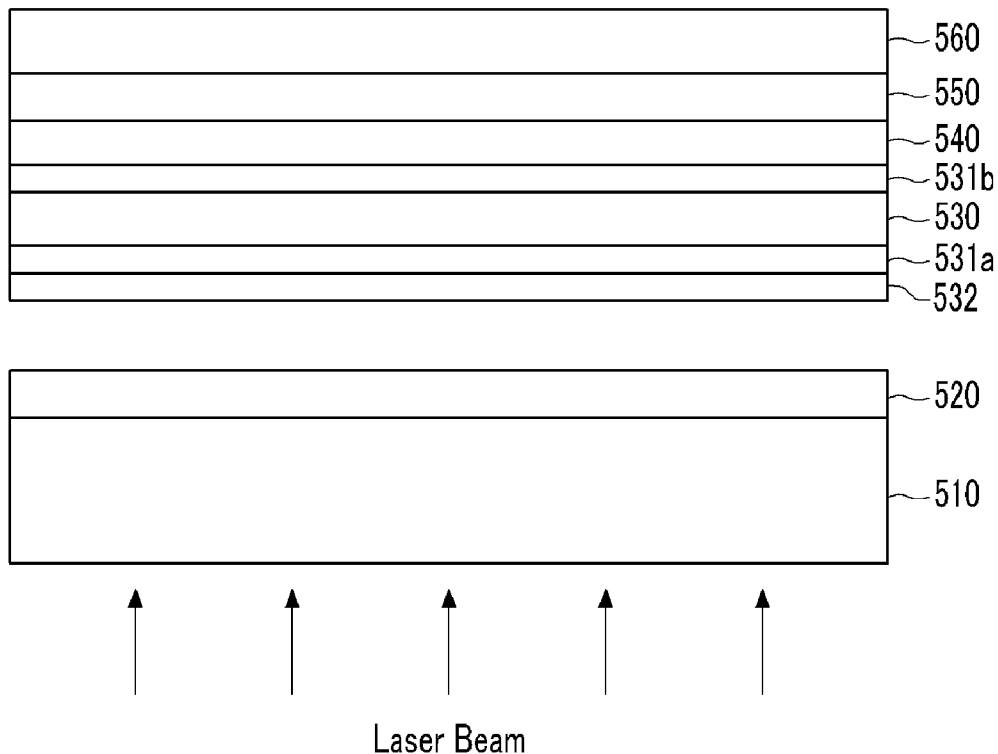
Figure 5F:
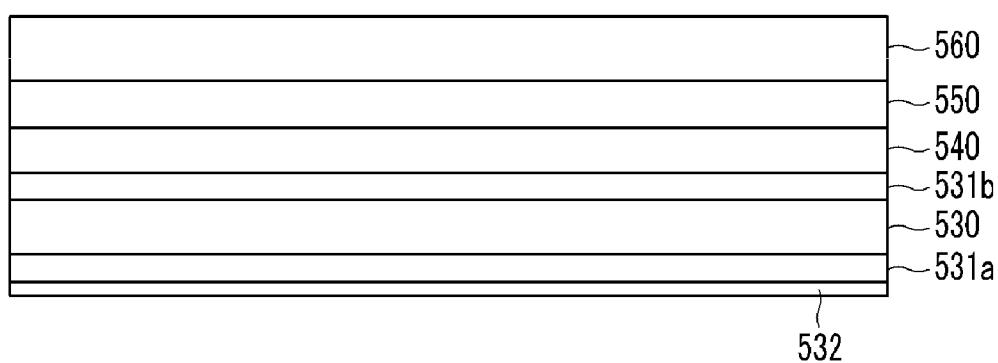

Referring to FIG. 5E and FIG. 5F, a flexible display device is then formed by irradiating a laser beam on a lower side of the carrier substrate 510 to separate the carrier substrate 510. One example of such a laser beam may be an excimer laser beam with a wavelength of approximately 308 nm.

When irradiating the laser onto the separation layer 532, in order to effectively separate the carrier substrate 510, the composition ratio of the silicon nitride of the separation layer 532 preferably satisfies the condition $0.18 \leq \{A1$ (an amount of nitride)$/B1$ (an amount of silicon)$\} \leq 0.90$.

Table 1 shows separation results for various compositions of the separation layer 532.

TABLE 1

| | Deposition temperature [° C.] | Ar/N2 | Ratio of Ar/N2 | N/Si | Thickness [A] | Separation result | | |
|---|---|---|---|---|---|---|---|---|
| | | | | | | 600 (mJ) | 800 (mJ) | 1000 (mJ) |
| SiNx | ROOM TEMP | 200/10 | 20:1 | 0.18 | 500 | ○ | ○ | ○ |
| | | 200/20 | 10:1 | 0.40 | 1000 | ○ | ○ | ○ |
| | | 450/50 | 9:1 | 0.57 | 500 | ○ | ○ | ○ |
| | | 350/50 | 7:1 | 0.70 | 500 | ○ | ○ | ○ |
| | | 250/50 | 5:1 | 0.87 | 500 | X | X | ○ |
| | | 150/50 | 3:1 | 0.97 | 1000 | X | X | X |
| | | 150/50 | 3:1 | 0.97 | 1500 | X | X | X |
| | 130 | 150/50 | 3:1 | 0.97 | 1000 | X | X | X |

When sputtering the silicon nitride, the composition of the silicon nitride layer varies according to gas ratios or flow ratios of argon (Ar) as a reaction gas and nitride as a target material. The unit of the gas ratio or the flow ratio is SCCM (standard cubic centimeters per minute). That is, when depositing, the nitride ratio in the silicon nitride is increased as the argon ratio is increased. As shown in Table 1, separation characteristics worsen as the value of N/Si approaches 1.00, and the separation characteristics improve as the amount of silicon increases relative to the amount of nitride, i.e. as N/Si decreases. Laser beams with energies of 600 mJ, 800 mJ, and 1000 mJ are irradiated to respectively measure the separation results. To obtain good separation for the laser energy of 600 mJ, 800 mJ, and 1000 mJ, according to an exemplary embodiment of the present invention, it has thus been determined that N/Si should preferably be kept in the range $0.18 \leq \{A1$ (the amount of nitride)$/B1$ (the amount of silicon)$\} \leq 0.70$. The gas ratio or the flow ratio of argon (Ar) and nitride corresponding thereto is in the range of 7:1 to 20:1.

If the composition ratio A1/B1 of the silicon nitride is less than 0.18, the separation layer 532 becomes too opaque for use in many liquid crystal displays.

From the above, irradiating a laser beam through the carrier substrate 510 and transparent adhesive layer 520, and onto separation layer 532, can act to break down the separation layer 532, i.e. alter its composition, and detach substrate 510 and adhesive layer 520 from the flexible substrate 530. In known manner, the laser beam may focus on the surface of the separation layer 532 by controlling the intensity of the laser beam and the depth of focus ("DOF") using optical instruments. Therefore, the laser beam need not pass through the flexible substrate 530 and the barrier layer 531b. Also, the second barrier layer 531b that the beam is not passed through may thus be omitted.

As shown in FIG. 5F, the above laser irradiation process retains a portion of separation layer 532 and substantially all of the barrier layer 531a. This keeps flexible substrate 530 from absorbing excessive amounts of gases or moisture.

From Table 1, one can also see that barrier layer 531 can be kept from separating from flexible substrate 530 by maintaining the N/Si ratio of the barrier layer 531 at or above approximately 0.90, i.e. within the range 0.90≦{A2 (the amount of nitride)/B2 (the amount of silicon)}.

FIG. 6A to FIG. 6F are cross-sectional views of a fabricating method of a flexible display device according to another exemplary embodiment of the present invention.

Figure 6A:
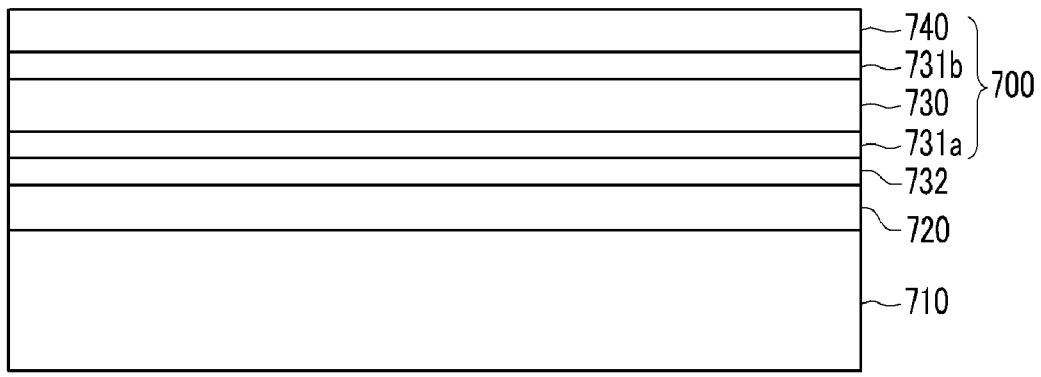
FIGS. 6A-6F are cross-sectional views showing a process of fabricating a flexible display device in accordance with another embodiment of the present invention.

Referring to FIG. 6A, a TFT substrate 700 is provided through processes of forming a transparent adhesive layer 720 on the first carrier substrate 710, laminating a flexible substrate 730 including a separation layer 732 and barrier layers 731a and 731b on the transparent adhesive layer 720, and forming a thin film transistor array 740. This is largely the same as for the exemplary embodiment shown in FIG. 5A to FIG. 5F. Accordingly, some details are omitted from the description of this method.

Figure 6B:
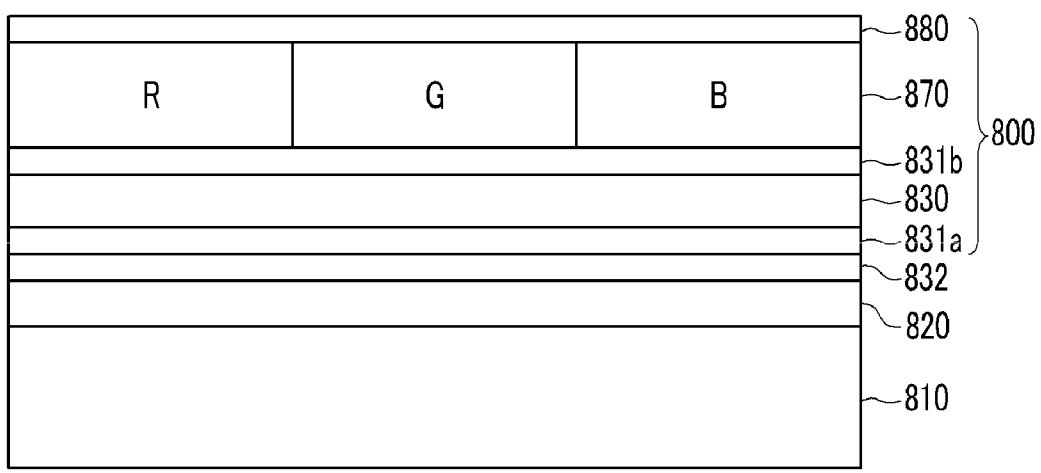

Referring to FIG. 6B, a color filter substrate 800 is processed by forming a transparent adhesive layer 820 on a second carrier substrate 810, laminating a flexible substrate 830 including a separation layer 832 and barrier layers 831a and 831b, forming a color filter array 870, and forming a transparent electrode 880. Here, except for forming the color filter array and the transparent electrode instead of forming the thin film transistor array on the flexible substrate 830, the characteristics and the fabricating method of the remaining constituent elements are the same as for the above-described exemplary embodiment.

Figure 6C:
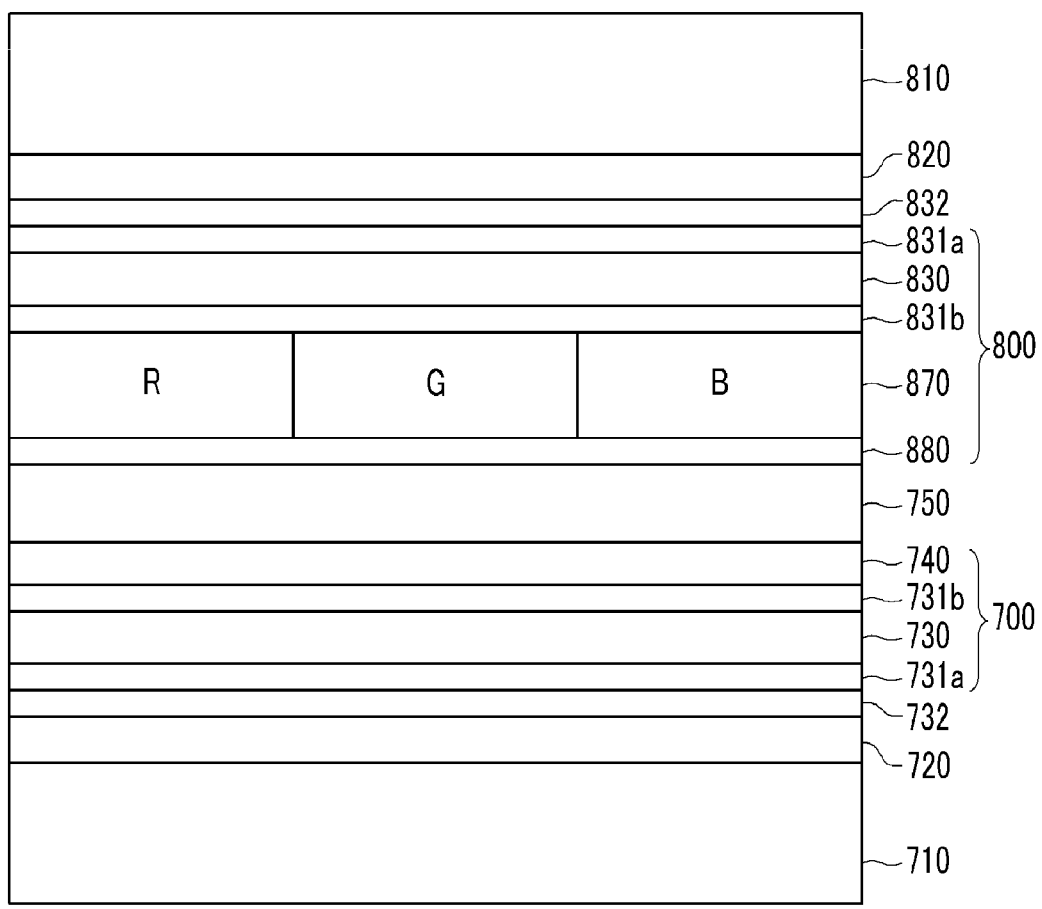

Next, referring to FIG. 6C, the color filter substrate 800 is placed to face the TFT substrate 700. A display layer 750 is formed between the TFT substrate 700 and the color filter array substrate 800. The display layer 750 may include at least one of a liquid crystal layer, an electrophoretic film, or a light emitting layer.

Figure 6D:
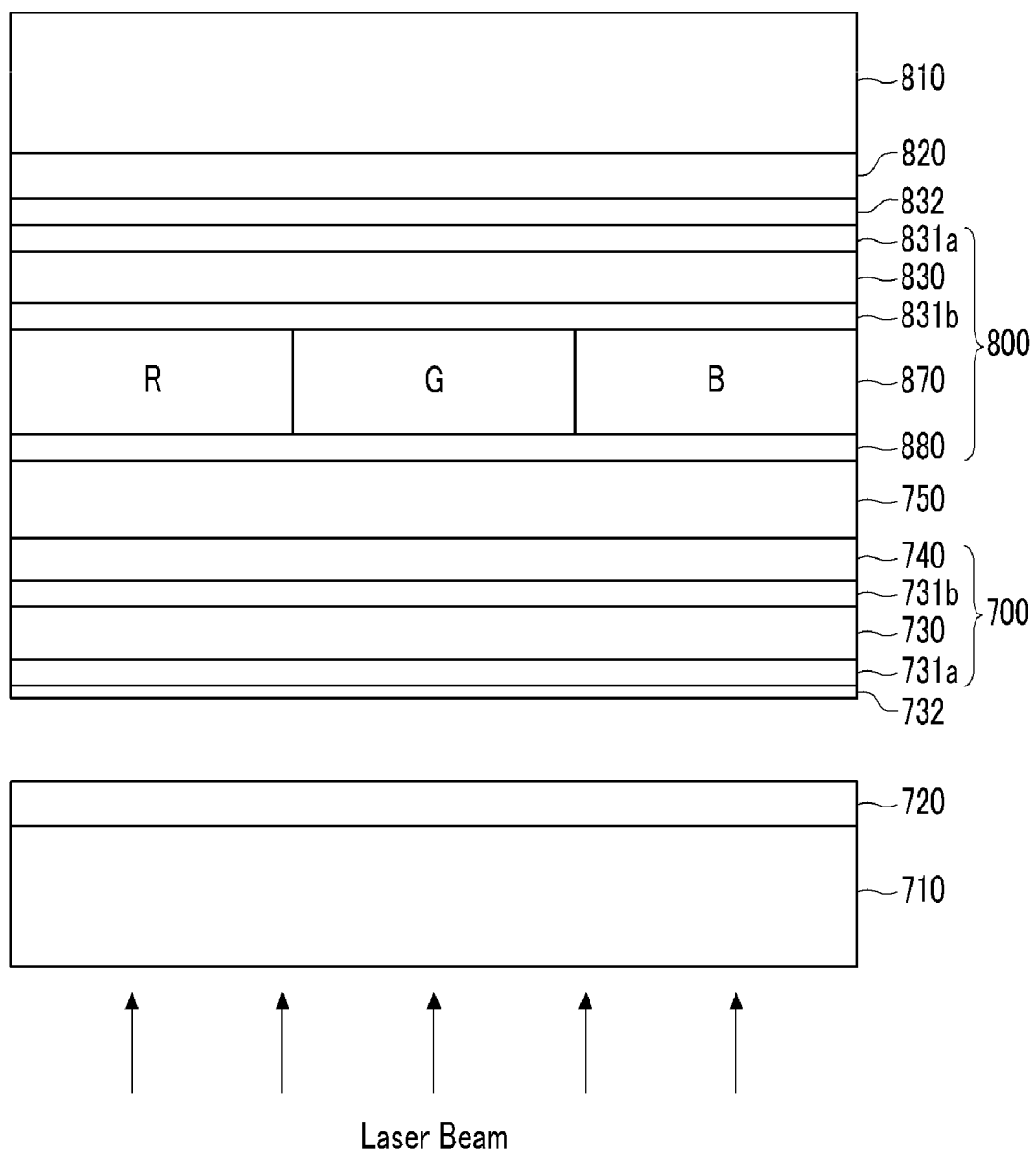

Referring to FIG. 6D, the first carrier substrate 710 and the transparent adhesive layer 720 are separated from the TFT substrate 700 by focusing and irradiating a laser beam onto the thin film transistor substrate 700.

Figure 6E:
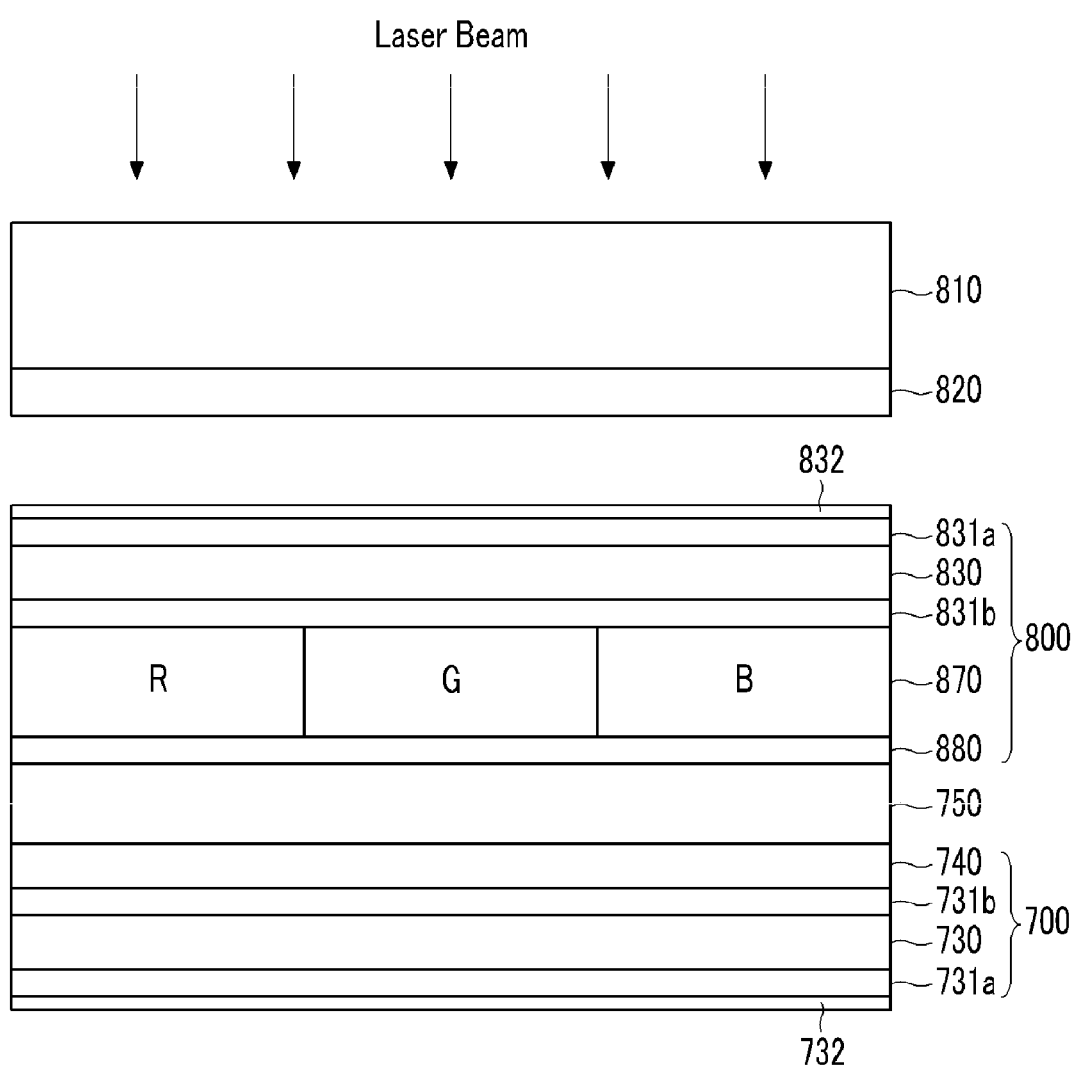

Referring to FIG. 6E, the second carrier substrate 810 and the transparent adhesive layer 820 are separated from the color filter substrate 800 by focusing and irradiating a laser beam onto the color filter substrate 800.

Figure 6F:
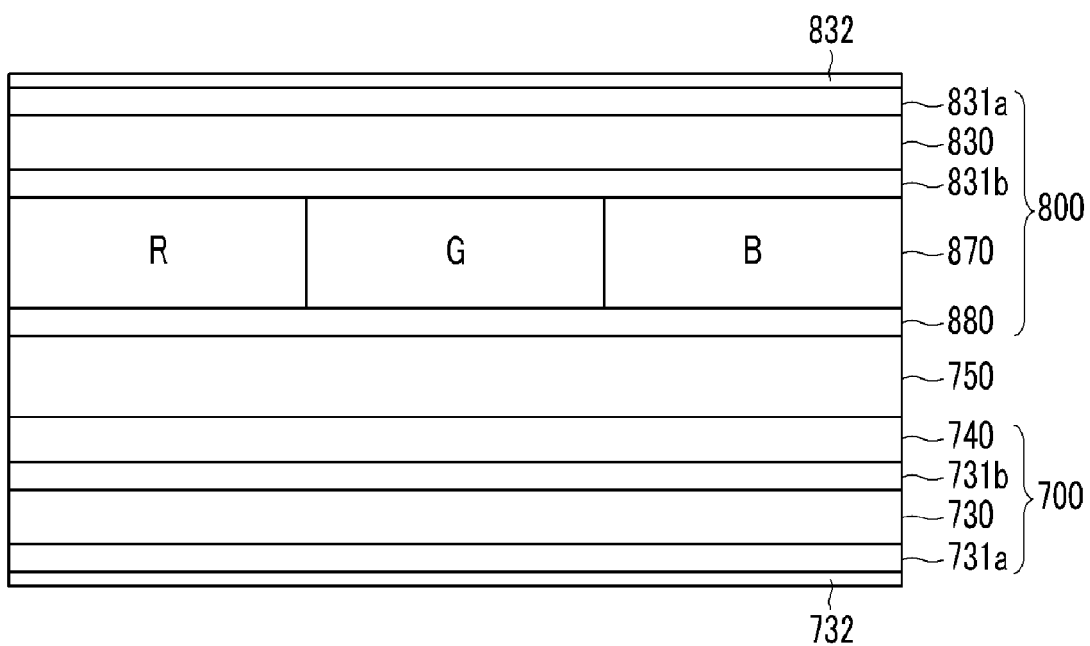

Next, as shown in FIG. 6F, the flexible display device may be obtained.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. For example, embodiments of the invention include employing separation layers with any amounts of nitride and silicon that allow for detachment of a carrier substrate from a flexible substrate after laser irradiation of the separation layers. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of fabricating a flexible display device, comprising:
    forming an adhesive layer on a first carrier substrate;
    laminating a first flexible substrate on the adhesive layer, so that a first separation layer of the first flexible substrate is disposed on the adhesive layer;
    forming a thin film transistor array on the first flexible substrate; and
    separating the first carrier substrate from the first flexible substrate by directing a laser beam onto the first separation layer,
    wherein the first separation layer comprises silicon nitride (SiNx), and wherein the silicon nitride of the first separation layer comprises an amount of nitride A1 and an amount of silicon B1, the amount of nitride A1 and the amount of silicon B1 satisfying $0.18 \leq \{A1/B1\} \leq 0.90$.

2. The method of claim 1, wherein
    the first flexible substrate further comprises a first barrier layer, and
    the first barrier layer contacts the first separation layer.

3. The method of claim 2, wherein
    the first barrier layer comprises silicon nitride, the silicon nitride of the first barrier layer comprising an amount of nitride A2 and an amount of silicon B2, and
    the amount of nitride A2 and the amount of silicon B2 satisfy the condition $(A2/B2)>(A1/B1)$.

4. The method of claim 3, wherein
    the amount of nitride A1 and the amount of silicon B1 satisfy the condition $0.18 \leq \{A1/B1\} \leq 0.70$.

5. The method of claim 4, further comprising:
    after the separating, maintaining a contact between the first barrier layer and a remainder of the first flexible substrate.

6. The method of claim 1, further comprising
    forming the first separation layer in the presence of a reaction gas, the reaction gas comprising argon and nitride in a ratio in the range of 7:1 to 20:1.

7. The method of claim 1, further comprising:
    after the forming a thin film transistor array, forming a display layer on the first flexible substrate; and
    forming an opposite substrate on the display layer.

8. The method of claim 7, wherein
    the display layer comprises at least one of a liquid crystal layer, an electrophoretic film, and a light emitting layer.

9. The method of claim 1, wherein the separating the first carrier substrate further comprises:
    directing a laser beam through the first carrier substrate so as to focus the laser beam on the first separation layer.

10. The method of claim 9, wherein
    the directing further comprises focusing the laser beam on the first separation layer so as to at least partially alter a composition of the first separation layer.

11. The method of claim 9, wherein
    the adhesive layer comprises a polymer adhesive comprising a series of at least one of silicon and an acryl.

12. The method of claim 11, wherein
    the adhesive layer comprises polydimethylsiloxane.

13. The method of claim 1, wherein
the laser beam comprises an excimer laser beam having a wavelength of approximately 265 nm to approximately 308 nm.

14. A method of fabricating a flexible display device, comprising
forming a first adhesive layer on a first carrier substrate;
laminating a first flexible substrate on the first adhesive layer so that a first separation layer of the first flexible substrate is disposed on the first adhesive layer;
forming a thin film transistor array on the first flexible substrate;
forming a second adhesive layer on a second carrier substrate;
laminating a second flexible substrate on the second adhesive layer so that a second separation layer of the second flexible substrate is disposed on the second adhesive layer;
forming a color filter array on the second flexible substrate;
coupling the first flexible substrate to the second flexible substrate;
separating the first carrier substrate from the first flexible substrate by directing a first laser beam onto the first separation layer; and
separating the second carrier substrate from the second flexible substrate by directing a second laser beam onto the second separation layer,
wherein the first separation layer comprises silicon nitride (SiNx), and wherein the silicon nitride of the first separation layer comprises an amount of nitride A1 and an amount of silicon B1, the amount of nitride A1 and the amount of silicon B1 satisfying $0.18 \leq \{A1/B1\} \leq 0.90$.

15. The method of claim 14, wherein
the first and second flexible substrates respectively further comprise first and second barrier layers,
the first barrier layer contacts the first separation layer, and
the second barrier layer contacts the second separation layer.

16. The method of claim 15, wherein
the first barrier layer and the second barrier layer each comprise silicon nitride.

17. The method of claim 16, further comprising
forming a display layer between the first flexible substrate and the second flexible substrate.

18. The method of claim 17, wherein
the display layer comprises at least one of a liquid crystal layer, an electrophoretic film, and a light emitting layer.

19. The method of claim 17, wherein:
the directing a first laser beam further comprises directing the first laser beam through the first adhesive layer so as to focus the first laser beam on a surface of the first separation layer; and
the directing a second laser beam further comprises directing the second laser beam through the second adhesive layer so as to focus the second laser beam on a surface of the second separation layer.

20. The method of claim 19, wherein
the first and second laser beams each comprise an excimer laser with a wavelength of approximately 265 nm to approximately 308 nm.

* * * * *